United States Patent [19]

Erhage

[11] Patent Number: 5,216,425
[45] Date of Patent: Jun. 1, 1993

[54] METHOD FOR REDUCING THE INFLUENCE OF DISTORTION PRODUCTS

[75] Inventor: Lars I. Erhage, Göteborg, Sweden

[73] Assignee: Telefonaktiebolaget LM Ericson, Stockholm, Sweden

[21] Appl. No.: 830,339

[22] Filed: Jan. 31, 1992

[30] Foreign Application Priority Data

Feb. 20, 1991 [SE] Sweden .................................. 9100501

[51] Int. Cl.⁵ .................................................. H03M 1/06
[52] U.S. Cl. ........................................ 341/118; 375/39
[58] Field of Search ................. 341/118, 155; 375/39, 375/57, 79; 329/345

[56] References Cited

U.S. PATENT DOCUMENTS

| | | | |
|---|---|---|---|
| 4,652,838 | 3/1987 | Nossen | 380/6 |
| 4,788,696 | 11/1988 | Sakane et al. | 375/111 |
| 4,875,049 | 10/1989 | Yoshida | 341/159 |
| 4,888,557 | 12/1989 | Puckette et al. | 329/341 |
| 4,926,180 | 5/1990 | Anastassiou | 341/159 |
| 5,058,134 | 10/1991 | Chevillat et al. | 375/39 |
| 5,170,415 | 12/1992 | Yoshida et al. | 375/80 |

Primary Examiner—Marc S. Hoff
Attorney, Agent, or Firm—Burns, Doane, Swecker & Mathis

[57] ABSTRACT

A method for reducing the influence of distortion product that are formed in conjunction with the analogue-digital-conversion of samples of an electric signal, from which signal two quadrature signals are formed prior to the conversion process. The quadrature signals are phase modulated prior to the conversion process and are phase demodulated subsequent to this conversion process, by phase-shifting the signals by a value which is changed randomly for each new sample. The energy content of individual distortion products is distributed over a broadband this in this way. This is due to correct demodulation of the useful signal, i.e., the fundamental tone, whereas harmonies and intermodulation products will have a residual phase modulation subsequent to the phase demodulating process.

7 Claims, 1 Drawing Sheet

¹

METHOD FOR REDUCING THE INFLUENCE OF DISTORTION PRODUCTS

TECHNICAL FILED

The invention relates to a method for reducing the influence of distortion products formed in a signal processing system in conjunction with the analogue-digital conversion of an electric signal, from which two quadrature signals are formed prior to the conversion process.

PRIOR ART

When an electric signal is to be processed in a system, it is often desired that signal processing is effected as linearly as possible. This will avoid the signal being distorted by non-linear distortion. Examples of signal processing include analogue-digital conversion, amplification and frequency conversion. Non-linearities of individual components included in a system are added together and consequently strict demands are placed on components which are included in large systems on which the requirement for linearity is high. Such systems are therefore often relatively expensive. Furthermore, the maximum linearity of a system is limited by the maximum performance in this respect of the individual, available components.

It can be mentioned by way of example that one problem which is liable to arise from non-linear distortion is that an airborne radar station will sometimes receive an echo from another aircraft simultaneously with a ground echo. In conjunction with analogue-digital conversion of the received signals, distortion products occur, i.e. harmonics and intermodulation products, such that the ground echo will give rise to a single large echo and a plurality of mutually different smaller echoes, unless the conversion is linear. In turn, this means that the echo from the second aircraft cannot always be detected, since a relatively high detection threshold must be used in order to filter out the smaller echoes caused by the non-linear conversion.

DISCLOSURE OF THE INVENTION

As indicated in the introduction, the object of the present invention is to reduce the influence of distortion products that are formed in conjunction with the analogue-digital conversion of samples of an electric signal, from which two quadrature signals are formed prior to said conversion. The desired result is achieved by phase modulating the quadrature signals prior to said conversion and by phase demodulating subsequent to said conversion with a value which is changed with each new sample, so that the energy content of individual distortion products will be spread out over a relatively broad band. This is made possible by the fact that only the useful signal, i.e. the fundamental tone, is correctly demodulated. Sub-harmonics and intermodulation products, on the other hand, will have a residual phase modulation subsequent to said demodulation process.

The characteristic features of the invention are set forth in the following Claims.

BRIEF DESCRIPTION OF THE DRAWING

The invention will now be described in more detail with reference to the accompanying drawing, the single Figure of which illustrates an exemplifying embodiment of an arrangement for carrying out the inventive method.

BEST MODE OF CARRYING OUT THE INVENTION

Figure 1:
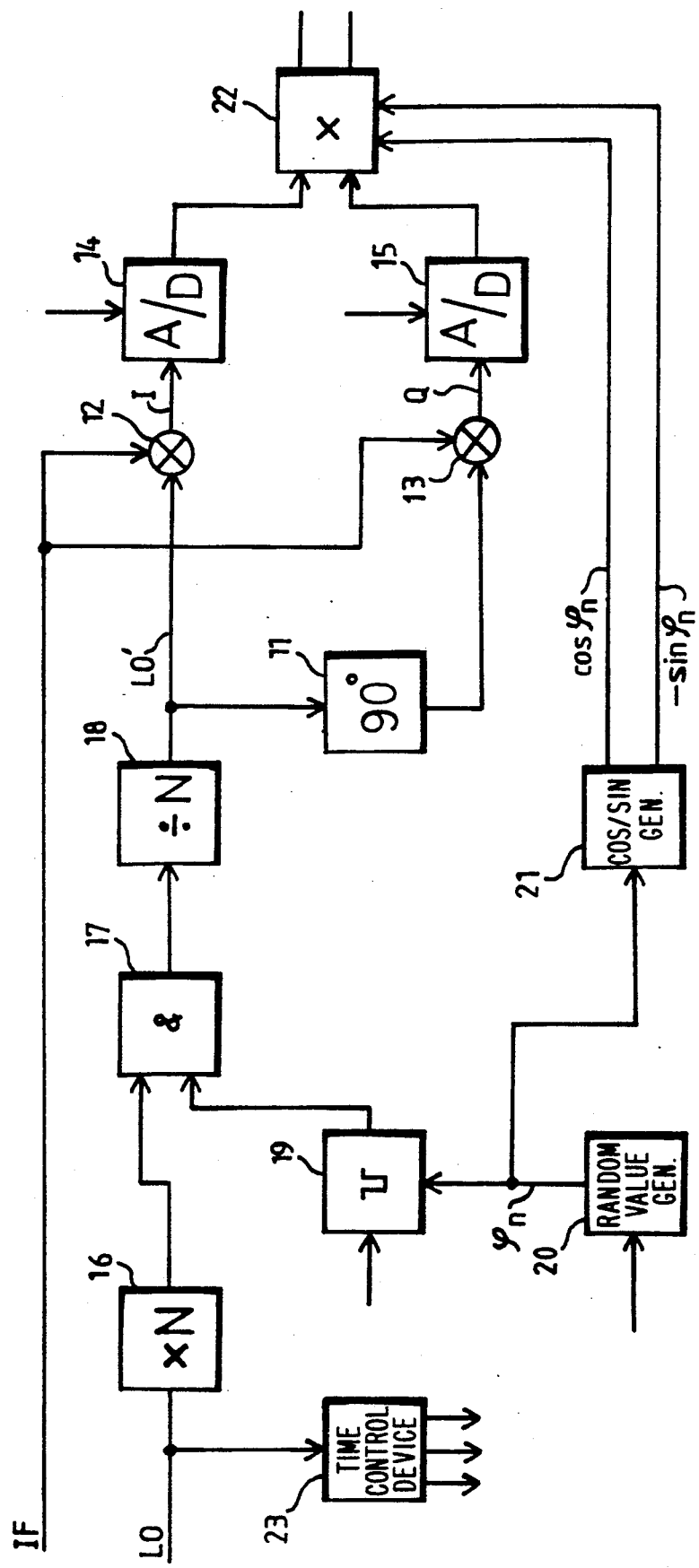

FIG. 1 illustrates an exemplifying embodiment of an arrangement for carrying out the inventive method. An input signal IF which lies on a carrier frequency LO and a reference signal LO having the frequency LO are delivered to the arrangement. Two quadrature signals I and Q in the baseband are formed from the input signal IF with the aid of a signal LO', a phase-shifting device 11 which shifts the phase through 90 degrees, and two mixers 12 and 13. Each of the two quadrature signals is delivered to a respective analogue-digital-converter 14 and 15. The signal LO' used to form the quadrature signals is, in turn, formed by the reference signal LO in a manner hereinafter described.

The expedient of forming two quadrature signals from a signal which is to be analogue-digital converted and then to convert each of the signals to a digital form belongs to the known prior art. This conversion is carried out in order to enhance the sensitivity of the system.

In the present example, the signal LO' used to produce the quadrature signals is formed in the following way. The reference signal having the frequency LO is delivered to a frequency multiplying device 16 which forms a signal whose frequency is N times higher than the frequency of the signal on its input. This results in a signal of frequency N*LO. This signal passes through an AND-gate 17 and is then delivered to a frequency divider 18 which divides the incoming frequency by N and thereby generates a signal having the frequency LO. This signal is designated LO'. The gate 17, however, is held closed over brief time intervals with the aid of pulses from a pulse generator 19 which is controlled by a random value generator 20. This latter generator generates random values which are designated $\phi_n$. In practice, these values may, for instance, be determined in accordance with the formula $\phi_n = m*(2\pi/N)$, where m is an integer which can be varied randomly between 0 and N-1. For instance, when N is equal to 4, $\phi_n$ will thus assume the values 0, $\pi/2$, $\pi$ and $3\pi/2$.

Each random value causes the pulse generator 19 to deliver a stop pulse to the gate 17, the duration of this pulse being proportional to the random value at that particular time. Because the signal having the high frequency N*LO is delayed in the gate 17 for a given period of time, the frequency divider 18 will also be stopped over the same length of time and thereafter will continue from the point at which it was interrupted. This results in a time delay of the divided signal LO', which in practice implies a phase shift of the signal LO' in relation to the reference signal LO. By suitable dimensioning of the components in the pulse generator 19, this means that the quadrature signals I, Q can be phase-modulated in the form of a phase shift with the value $\phi_n$ from the random value generator 20. A new phase shift value $\phi_n$ is generated by the random value generator 20 for each new sample of the input signal IF to be converted to digital form. Thus, the quadrature signals I, Q are phase-shifted with a new value for each new sample of the input signal IF.

Reference 23 identifies a time control device which is controlled by the reference signal LO and which functions to generate signals for activation of the analogue-digital-converters 14, 15, the pulse generator 19 and the random value generator 20. These signals are identified symbolically in the drawing by means of arrows.

The phase shift value $\phi_n$ is also delivered to a device 21 which forms the values $\cos \phi_n$ and $-\sine \phi_n$ from the value $\phi_n$, each of these values being applied to a respective output line. These values and the digitally-converted samples of the quadrature signals from the analogue-digital-converters 14, 15 are delivered to a complex multiplier 22. The quadrature signals from the converters 14, 15 are decoded, i.e. phase demodulated, in the complex multiplier, by multiplying two complex numbers, of which one is formed by the quadrature signals and the other is formed by the values $\cos \phi_n$ and $-\sine \phi_n$. Decoding corresponds to a phase shift through the angle $-\phi_n$, i.e. a phase shift whose magnitude is equal to the phase shift effected when forming the quadrature signals, but in an opposite direction.

The analogue-digital-conversion results in the formation of distortion products in the form of harmonics and intermodulation products, because the conversion is not carried out linearly. In the absence of phase modulation, i.e. phase shift, as described above, a sinus signal, sine $\omega t$, would consist of the following components subsequent to non-linear conversion as a result of the formation of harmonics: $k1^*\sine \omega t_k + k2^*\sine 2\omega t_k + k3^*\sine 3\omega t_k$, and so on. The time variable $t_k$ is equal to $k^*T$, where k assumes the values $0,1,2,\ldots$, and where T is the sampling period. If phase modulation is applied, there is obtained instead: $k1^*\sine)\omega t_k + \phi_n) + k2^*\sine(2\omega t_k + 2\phi_n) + k3^*\sine(3\omega t_k + 3\phi_n)$, and so on.

In the phase demodulation process which follows the non-linear conversion, the signal is phase shifted through the angle $-\phi_n$. This means that the useful signal, i.e. the fundamental tone $k1^*\sine(\omega t_k + \phi_n)$, will be phase demodulated with a correct phase value, whereas harmonics, on the other hand, will be demodulated with an erroneous phase value. The useful signal will thus be demodulated correctly to $k1^*\sine \omega t_k$, whereas the first harmonic will be changed to $k2^*\sine(2\omega t_k \phi_n)$, the second harmonic will be changed to $k3^*\sine(3\omega t_k + 2\phi_n)$, and so on. Of these harmonics, there will thus be found after phase demodulation a residual phase modulation, $\phi_n$, $2\phi_n$, and so on. It can be shown that a residual phase modulation will also be found with the intermodulation products that are formed because of non-linearities in the conversion process.

It has been assumed in the aforegoing that phase modulation and phase demodulation, i.e. the phase shifts $\phi_n$ and $-\phi_n$ respectively, are varied randomly from one sample to the next. This means that the energy content of individual distortion products will be distributed over a broad frequency band. Theoretically, it would be appropriate to select a random phase modulation whose autocorrelation function $r(t)=0$ for $t=0$, which will enable the energy to be uniformly distributed to the best extent possible.

Each digital signal value obtained subsequent to demodulation, i.e. obtained on the outputs of the multiplier 22, consists of the sum of a sample of the useful signal and a number of distortion products formed in the analogue-digital-conversion process. The distortion products have a residual phase modulation $\phi_n$, $2\phi_n$, and so on. Each individual digital value can therewith be an erroneous value, i.e. may deviate from the value of the useful signal. On the other hand, the digital values will, on average, coincide with the values of the useful signal, since the phase shifts, i.e. the values of $\phi_n$, will vary randomly from time to time. As mentioned above, this means that the energy content of the distortion products will be distributed over a broadband. Consequently, these distortion products can be suppressed with the aid of a narrow band filter.

The illustrated exemplifying embodiment can be modified in various ways. For example, the phase modulating process can be carried out subsequent to forming the quadrature signals, instead of in conjunction with the formation of said signals. Naturally, the signal LO' may also be formed in a manner different to that described above. Neither is it necessary to vary the phase shifts fully randomly from time to time. For example, the values $_n$ can be formed in accordance with the formula $\phi_n = \phi_0 * n^2$, where $\phi_0$ is a low initial value of the phase shift and n is increased for each new sample by the value of one. This results in a linear change in the frequency of the signal LO'. It is also conceivable, for instance, to effect phase demodulation by so-called table-reading with the aid of a read memory, a so-called PROM, instead of by the aforedescribed method.

It is, of course, possible to embody the invention in specific forms other than those described above without departing form the spirit of the invention. The embodiments described above are merely illustrative and should not be considered restrictive in any way. The scope of the invention is given by the appended claims, rather than the preceding description, and all variations and equivalents which fall within the rand of the claims are intended to be embraced therein.

I claim:

1. A method for reducing the influence of distortion products formed in a signal processing system in conjunction with the analogue-digital-conversion of sample of an electric signal, from which tow quadrature signals are formed prior to the conversion, comprising the steps of: phase modulation the quadrature signals prior to said conversion process; subsequently phased modulation the digital signal formed by siad conversion process; and effecting said phase modulation and siad phase demodulation by phase shifting in mutually opposite direction by a value which is changed in time in a manner such that the energy content of individual distortion products will be distributed over a frequency band.

2. A method according to claim 1, further comprising the step of forming the quadrature signals with the aid of a clock signal form which a shifted clock signal is formed by phase shifting by a value which is changed for each new sample of the quadrature signals to be analogue-digital-converted.

3. A method according to claim 2, further comprising the step of calculating for each new sample to be analogue-digital-converted a cosine value and a negative sine value for the value by which the quadrature signals are phase shifted; and effecting said phase modulation by multiplication of two complex numbers of which one is formed by said cosine and sine values and the other is formed by the digital signals formed by said analogue-digital-conversion.

4. A method according to claim 2, wherein the phase shifting comprises randomly changing the value by which the quadrature signals are phase shifted prior to said conversion for each new sample of the quadrature signals to be converted.

5. A method according to claim 1, further comprising the step of calculating for each new sample to be analogue-digital-converted a cosine value and a negative sine value of the value by which the quadrature signals are phase shifted; and effecting said phase modulation by multiplication of two complex numbers of which one is formed by said cosine and sine values and the other is formed by the digital signals formed by said analogue-digital-conversion.

6. A method according to claim 5, wherein the phase shifting comprises randomly changing the value by which the quadrature signals are phase shifted prior to said conversion for each new sample of the quadrature signals to be converted.

7. A method according to claim 1, wherein the phase shifting comprises randomly changing the value by which the quadrature signals are phase shifted prior to said conversion for each new sample of the quadrature signals to be converted.

* * * * *